(12) United States Patent
Nagasawa et al.

(10) Patent No.: US 9,693,476 B2
(45) Date of Patent: Jun. 27, 2017

(54) POWER CONVERSION APPARATUS (71) Applicant: Keihin Corporation, Tokyo (JP)

(72) Inventors: Kazuya Nagasawa, Tochigi (JP); Hiroaki Iida, Tochigi (JP); Morifumi Shigemasa, Tochigi (JP); Yasuhiro Maeda, Tochigi (JP); Masami Ogura, Tochigi (JP); Hitoshi Nishio, Wako (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 14/828,843

(22) Filed: Aug. 18, 2015

(65) Prior Publication Data

US 2016/0079744 A1  Mar. 17, 2016

(30) Foreign Application Priority Data

Sep. 11, 2014 (JP) .................................. 2014-185133

(51) Int. Cl.
*H05K 7/14* (2006.01)
*H02M 1/32* (2007.01)

(52) U.S. Cl.
CPC ..... *H05K 7/1432* (2013.01); *H02M 2001/327* (2013.01)

(58) Field of Classification Search
CPC .................................................. H05K 7/20927
USPC ........................................................ 361/699
See application file for complete search history.

(56) References Cited

U.S. PATENT DOCUMENTS

| 7,092,238 | B2* | 8/2006 | Saito | H01G 2/10 361/301.5 |
|---|---|---|---|---|
| 7,751,193 | B2* | 7/2010 | Tominaga | H05K 3/32 165/185 |
| 8,363,420 | B2* | 1/2013 | Tominaga | H05K 3/32 361/715 |
| 2009/0002956 | A1* | 1/2009 | Suwa | B60L 1/003 361/728 |
| 2010/0053927 | A1* | 3/2010 | Inoue | H01G 2/04 361/830 |
| 2010/0202095 | A1* | 8/2010 | Kyouda | H01G 2/106 361/301.3 |
| 2010/0328901 | A1* | 12/2010 | Minato | H01L 21/561 361/730 |

(Continued)

FOREIGN PATENT DOCUMENTS

JP 2007-236044 A 9/2007
JP 4640213 B2 3/2011

*Primary Examiner* — Tuan T Dinh
*Assistant Examiner* — Rockshana Chowdhury
(74) *Attorney, Agent, or Firm* — Westerman, Hattori, Daniels & Adrian, LLP (57) ABSTRACT A power conversion apparatus has a configuration in which plate-like bus-bars are laminated via an insulating material to define a pair of bus-bars. A laminated bus-bar, in which the pair of bus-bars is disposed vertically so that a width direction thereof is in a vertical direction, includes a pair of voltage measuring terminals that is correspondingly branched from a part of the pair of bus-bars to extend toward a circuit board. The pair of voltage measuring terminals is arranged symmetrically with respect to the pair of bus-bars to extend upward toward the circuit board, while extending in an intersecting direction intersecting with the pair of bus-bars, to be electrically connected to the circuit board.

4 Claims, 4 Drawing Sheets (56) References Cited

U.S. PATENT DOCUMENTS

2011/0249421 A1* 10/2011 Matsuo .................... B60L 7/14
361/821
2013/0021749 A1* 1/2013 Nakajima ............. H02M 7/003
361/689

* cited by examiner

POWER CONVERSION APPARATUS

BACKGROUND OF THE INVENTION

The present invention relates to a power conversion apparatus, and more particularly relates to a power conversion apparatus that can be preferably applied to a vehicle such as a hybrid car.

In recent years, in vehicles such as a four-wheeled vehicle, hybrid cars that use an engine being an internal combustion engine and an electric motor in cooperation for a drive system have been widely used.

In such hybrid cars, as one of an electronic control apparatus that operates an engine and an electric motor in a cooperated state, a power control apparatus that has a power conversion apparatus incorporated therein has been used. The power conversion apparatus is for inputting and outputting relatively large electric power. Therefore, a plurality of plate-like bus-bars made of a metal material are routed as electric wiring.

These bus-bars are routed in a case in which a plurality of semiconductor elements and the like that perform a switching operation at the time of power conversion are housed. Therefore, the bus-bars need to be routed in the case so as not to unnecessarily increase the size of the power conversion apparatus.

Under such circumstances, Japanese Patent Application Laid-open Publication No. 2007-236044 relates to a power semiconductor device and an inverter bridge module, and discloses a configuration in which at least a pair of power semiconductor devices is arranged so as to have a P bus-bar 1 and an N bus-bar 2 therebetween. The power semiconductor device includes a first collector terminal 5 pulled out from a first side surface of a casing, a first emitter terminal 6 pulled out from the first side surface of the casing, and a second collector terminal 7 or a second emitter terminal 8 pulled out from a second side surface opposite to the first side surface of the casing and electrically connected to the first collector terminal 5 or the first emitter terminal 6 inside the casing. The P bus-bar 1 and the N bus-bar 2 are juxtaposed in parallel and close to each other by extracting an output terminal from the second collector terminal 7 or the second emitter terminal 8.

SUMMARY OF THE INVENTION

However, according to studies by the present inventors, in the configuration of Japanese Patent Application Laid-open Publication No. 2007-236044, because the P bus-bar 1 and the N bus-bar 2 are juxtaposed in parallel and close to each other, the distance between the P bus-bar 1 and the N bus-bar 2 can be set to be small. However, relatively large power is input to the bus-bars by raising the voltage of a battery or the like. Therefore, it may become necessary to measure the voltage (potential) of the bus-bars. Such necessity increases when the configuration of the bus-bars becomes complicated such that the bus-bars are routed in a laminated structure.

According to further studies by the present inventors, in the configuration of Japanese Patent Application Laid-open Publication No. 2007-236044, a configuration of measuring the voltage of the bus-bars is not disclosed at all, and if the voltage of the bus-bars is to be measured, a harness or a terminal for measuring the voltage needs to be connected to the bus-bars separately, thereby increasing the number of components and assembly man-hours, and thus there is room for improvement.

The present invention has been achieved in view of the above studies, and an object of the present invention is to provide a power conversion apparatus that can measure the voltage of a bus-bar with a simple structure, while improving solderability and ensuring insulation properties.

To achieve the above object, a first aspect of the present invention is to provide a power conversion apparatus comprising a semiconductor element, a cooler that cools the semiconductor element, a circuit board electrically connected to the semiconductor element, and a laminated bus-bar electrically connected to the semiconductor element, with the semiconductor element and the laminated bus-bar being disposed above the cooler, and the circuit board being further disposed above the semiconductor element and the laminated bus-bar, to exhibit a power converting function by a switching operation of the semiconductor element. Here, the laminated bus-bar has a configuration in which plate-like bus-bars are laminated via an insulating material to define a pair of bus-bars, and the pair of bus-bars is disposed vertically so that a width direction thereof is set in a vertical direction. Also, the laminated bus-bar includes a pair of voltage measuring terminals that is correspondingly branched from a part of the pair of bus-bars to extend toward the circuit board to be electrically connected thereto, and the pair of voltage measuring terminals is arranged symmetrically with respect to the pair of bus-bars to extend upward toward the circuit board, while extending in an intersecting direction intersecting with the pair of bus-bars, to be electrically connected to the circuit board.

According to a second aspect of the present invention, in addition to the first aspect, each one of the pair of bus-bars includes a plate-like high height portion and a plate-like low height portion having a shorter vertical length than the high height portion, each one of the pair of voltage measuring terminals includes a projecting portion extending in the intersecting direction from an upper end portion of the high height portion and an upright portion extending upward from the projecting portion, and an upper end of the projecting portion is set to be flush with an upper end of the corresponding high height portion and an upper portion of the upright portion is set as a measuring terminal portion and electrically connected to the circuit board.

According to a third aspect of the present invention, in addition to the first and second aspects, the power conversion apparatus further comprises a resin case for housing the semiconductor element, a part of the laminated bus-bar is molded in the resin case, the resin case has a pair of concave portions by depressing an upper end face of a peripheral wall thereof, and the pair of voltage measuring terminals is extended out upward correspondingly from the pair of concave portions.

According to a fourth aspect of the present invention, in addition to the third aspect, each one of the pair of concave portions has a convex portion projected from a bottom portion of the pair of concave portions in a portion where the pair of voltage measuring terminals is correspondingly extended out.

According to the power conversion apparatus of the first aspect of the present invention, the laminated bus-bar electrically connected to the semiconductor element has a configuration in which the pair of plate-like bus-bars is formed by laminating the pair of bus-bars via the insulating material, and the pair of bus-bars is disposed vertically so that the width direction thereof is set as a vertical direction. Further, the laminated bus-bar includes the pair of voltage measuring terminals that is correspondingly branched from a part of the pair of bus-bars to extend toward the circuit board, to be electrically connected to the circuit board. The pair of voltage measuring terminals is arranged symmetrically with respect to the pair of bus-bars to extend upward toward the circuit board, while extending in the intersecting direction intersecting with the pair of bus-bars, and electrically connected to the circuit board. Accordingly, a power conversion apparatus that can measure the voltage of the bus-bar with a simple structure, while improving solderability and ensuring insulation properties can be provided. Particularly, because the pair of voltage measuring terminals is arranged symmetrically with respect to the pair of bus-bars to extend upward toward the circuit board, while extending in the intersecting direction intersecting with the pair of bus-bars, and electrically connected to the circuit board, the number of components can be reduced, and space saving and downsizing of the entire configuration can be realized, while reducing impact on the reactance of the laminated bus-bar. Further, the length of the voltage measuring terminal can be increased, to increase thermal resistance of a voltage measuring path. Accordingly, heat dissipation to the pair of bus-bars from the pair of voltage measuring terminals can be decreased, and as a result, solderability at the time of flow soldering or the like can be improved.

According to the power conversion apparatus of the second aspect of the present invention, each one of the pair of bus-bars includes the plate-like high height portion and the plate-like low height portion having a shorter vertical length than the high height portion. Each one of the pair of voltage measuring terminals includes the projecting portion extending in the intersecting direction from the upper end portion of the high height portion and the upright portion extending upward from the projecting portion, and the upper end of the projecting portion is set to be flush with the upper end of the corresponding high height portion, and the upper portion of the upright portion is set in the measuring terminal portion and electrically connected to the circuit board. Accordingly, the yield at the time of molding the pair of bus-bars can be improved and space saving and downsizing of the entire configuration can be realized, while the reactance of the laminated bus-bar is not unnecessarily increased.

According to the power conversion apparatus of the third aspect of the present invention, the resin case for housing the semiconductor element is further provided. A part of the laminated bus-bar is molded in the resin case, the resin case has the pair of concave portions by depressing the upper end face of the peripheral wall thereof, and the pair of voltage measuring terminals is extended out upward correspondingly from the pair of concave portions. Accordingly, a clearance space of a fillet formed at the time of soldering the measuring terminal portion can be ensured, while electrically insulating a portion including the measuring terminal portion of the laminated bus-bar, with the number of components being reduced. As a result, a gap between the circuit board and the laminated bus-bar can be narrowed, thereby enabling to reduce the size of the resin case.

According to the power conversion apparatus of the fourth aspect of the present invention, each one of the pair of concave portions has a convex portion formed in a projecting manner in the bottom portion of the corresponding concave portions where the pair of voltage measuring terminals is correspondingly extended out. Accordingly, anchorage strength and position accuracy of the pair of voltage measuring terminals can be improved.

DETAILED DESCRIPTION OF THE PREFERRED EMBODIMENT

Embodiments of a power conversion apparatus according to the present invention are explained in detail below with reference to the accompanying drawings. In the drawings, an x-axis, a y-axis, and a z-axis form a triaxial rectangular coordinate system, and a direction of the z-axis corresponds to a vertical direction.

[Configuration of Power Control Apparatus]

A configuration of a power control apparatus to which the power conversion apparatus according to the present embodiment is applied is described in detail with reference to FIG. 1.

Figure 1:
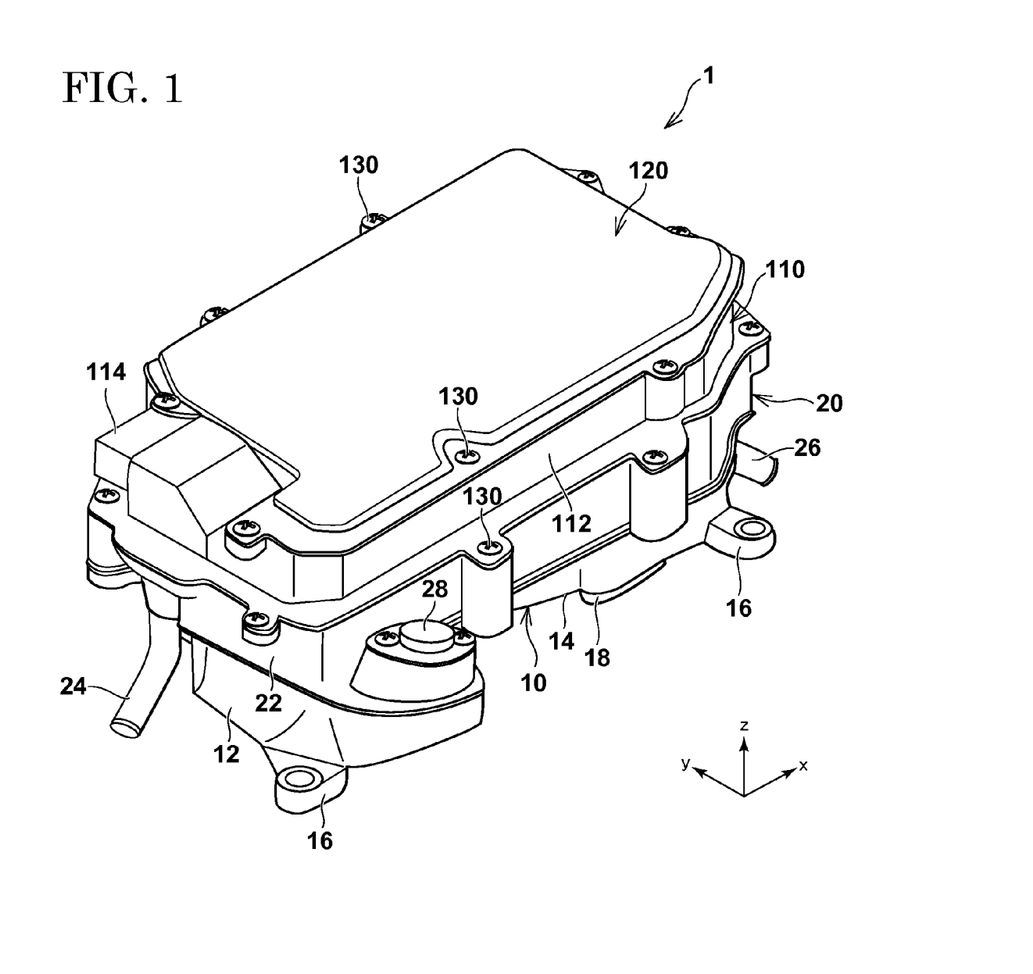
FIG. 1 is a perspective view showing a configuration of a power control apparatus to which a power conversion apparatus of the present embodiment is applied.

FIG. 1 is a perspective view showing the configuration of the power control apparatus to which the power conversion apparatus of the present embodiment is applied.

As shown in FIG. 1, a power control apparatus 1 includes a lower case 10 arranged at a lowermost part thereof, a middle case 20 fixed on the lower case 10, an upper case 110 fixed on the middle case 20, and a cover 120 fixed on the upper case 110 to close an uppermost part of the power control apparatus 1. The power control apparatus 1 is mounted on a vehicle such as a hybrid car (not shown). The lower case 10, the middle case 20, the upper case 110, and the cover 120 are typically castings made of metal such as an aluminum material or a formed article by means of press work, and are fastened by a fastener member 130 such as a bolt to form an assembly. The power control apparatus 1 typically controls power supplied from a battery (not shown) being a secondary battery to an electric drive motor, and power supplied from a regeneration mechanism (not shown) to the battery, both of the battery and the regeneration mechanism being mounted on the vehicle. The power control apparatus 1 can control only either of the power supplied in this manner, as required.

Specifically, the lower case 10 includes a lower peripheral wall 12 that moves around a vertical axis on a plane parallel to an x-y plane, a bottom wall 14 to close the bottom portion of the lower case 10, and fixing parts 16 being a mounting part to a vehicle, which are arranged at four corners of the lower peripheral wall 12. In the lower case 10, a smoothing capacitor (not shown) and the like are housed and mounted, and a three-phase current connector extending downward from the lower case 10 with a lower end portion exposed outward is mounted via the bottom wall 14. In FIG. 1, only a three-phase current connector 18 on an input side is shown.

The middle case 20 includes a middle peripheral wall 22 that moves around the vertical axis on the plane parallel to the x-y plane, a coolant feed pipe 24 fixed to the middle peripheral wall 22 to supply a coolant to the middle case 20, a coolant exhaust pipe 26 fixed to the middle peripheral wall 22 to discharge the coolant supplied to the middle case 20, and a DC current connector 28 fixed to a flared portion continuous to the middle peripheral wall 22. In the middle case 20, a step up/down reactor (not shown) is housed and mounted, and a power conversion apparatus 2 described later in detail is housed and mounted. The step up/down reactor functions as a step-up reactor when power is supplied from the battery to the electric drive motor, and functions as a step-down reactor when power is supplied from the regeneration mechanism to the battery.

The upper case 110 includes an upper peripheral wall 112 that moves around the vertical axis on the plane parallel to the x-y plane, and an input/output signal connector 114 attached to the upper peripheral wall 112. In the upper case 110, an ECU (Electronic Control Unit) (not shown) for power control is housed and mounted.

The cover 120 is a plate-like member with an outer peripheral edge portion thereof fixed to the upper peripheral wall 112 of the upper case 110. The lower peripheral wall 12 of the lower case 10, the middle peripheral wall 22 of the middle case 20, the upper peripheral wall 112 of the upper case 110, the bottom wall 14 of the lower case 10, and the cover 120 define a housing space therein.

[Configuration of Power Conversion Apparatus]

A configuration of the power conversion apparatus according to the present embodiment is described in detail with reference to FIG. 2A to FIG. 3A as well.

Figure 2A:
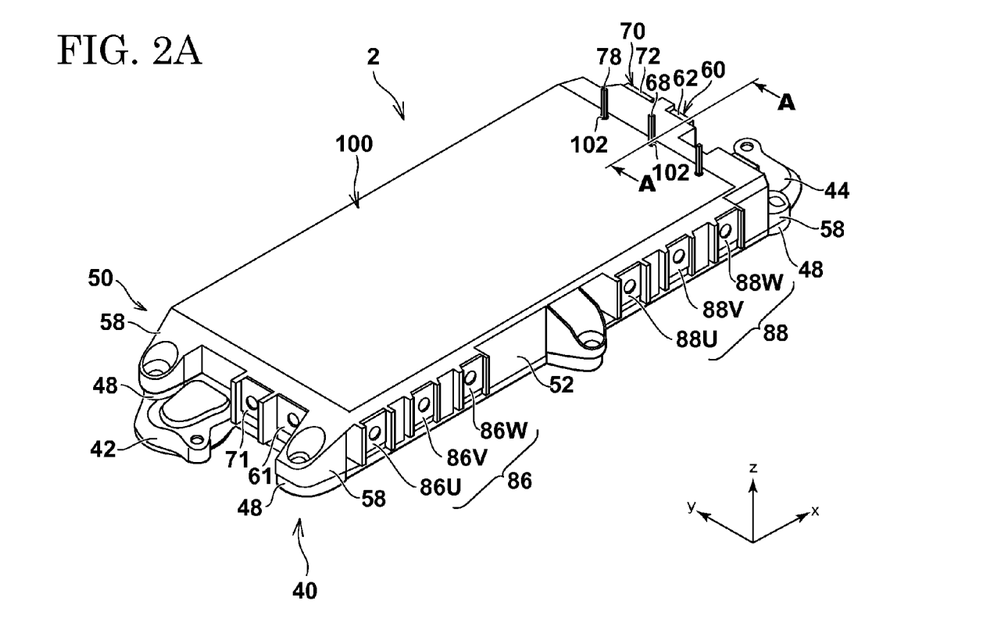
FIG. 2A is a perspective view showing a configuration of the power conversion apparatus according to the present embodiment.
Figure 2B:
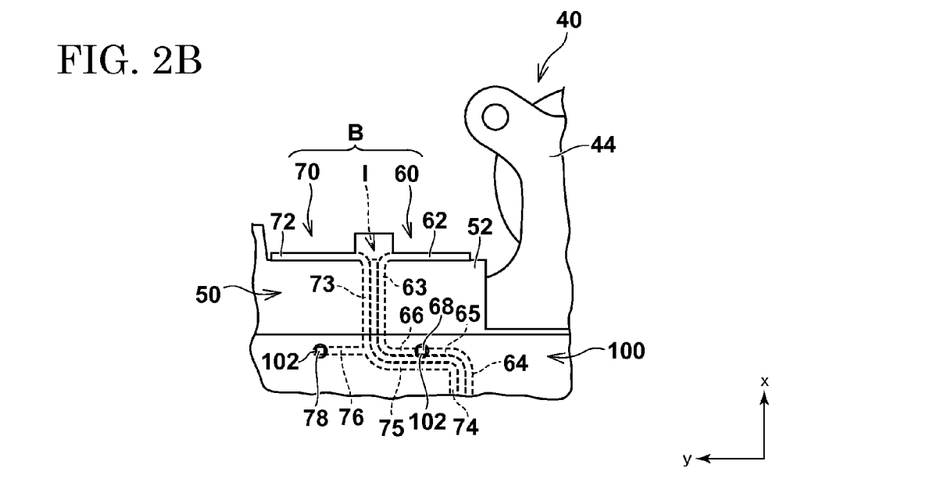
FIG. 2B is a partially enlarged plan view of the power conversion apparatus according to the present embodiment.
Figure 3A:
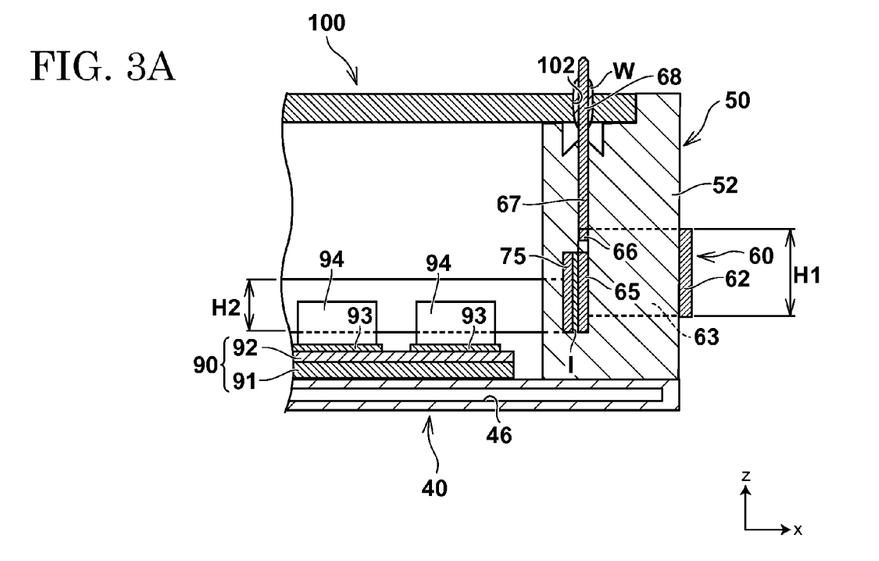
FIG. 3A is a partially enlarged sectional view along a line A-A in FIG. 2A.

FIG. 2A is a perspective view showing the configuration of the power conversion apparatus according to the present embodiment. FIG. 2B is a partially enlarged plan view of the power conversion apparatus according to the present embodiment. FIG. 3A is a partially enlarged sectional view along a line A-A in FIG. 2A.

As shown in FIGS. 2A to 3A, a power conversion apparatus 2 includes a cooler 40, which is a water-cooling type fixed to the middle case 20 to cool constituent elements therein, a case 50 fixed on the cooler 40, a lower circuit board 90 housed in the case 50 and mounted on the cooler 40, a plurality of semiconductor elements 94 electrically connected to the lower circuit board 90 and mounted thereon via a solder layer 93, and an upper circuit board 100 electrically connected to the semiconductor elements 94 and mounted on an upper portion of the case 50 above the semiconductor elements 94. The power conversion apparatus 2 also includes a laminated bus-bar B mounted on the lower circuit board 90 while being electrically connected to the lower circuit board 90, the semiconductor elements 94, and the upper circuit board 100, with opposite ends on positive and negative sides of the x-axis extending outside of the case 50 and fixed thereto while extending in a space between the semiconductor elements 94 in the case 50, and formed of a first bus-bar 60, a second bus-bar 70, and an insulating material I arranged therebetween. Further, the power conversion apparatus 2 includes an output-side three-phase terminal 86 fixed to the case 50, and an input-side three-phase terminal 88 fixed to the case 50. As a result, the cooler 40, the lower circuit board 90, the solder layer 93, the semiconductor elements 94, and the upper circuit board 100 are sequentially stacked in a vertical direction, and the lower circuit board 90, the solder layer 93, and the semiconductor elements 94 are housed in the case 50. The power conversion apparatus 2 typically has both a DC (Direct Current)/AC (Alternate Current) conversion function for converting DC power from the battery to three-phase current power to supply the three-phase current power to the electric drive motor, and an AC/DC conversion function for converting three-phase current power from the regeneration mechanism to DC power to supply the DC power to the battery. The power conversion apparatus 2 can have one of the DC/AC conversion function and the AC/DC conversion function as required.

The cooler 40 is typically a casting molded article made of metal such as an aluminum material, and includes a coolant introducing pipe 42 communicating with the coolant feed pipe 24, a coolant deriving pipe 44 communicating with the coolant exhaust pipe 26, a coolant flow path 46 communicating between the coolant introducing pipe 42 and the coolant deriving pipe 44, and four support portions 48 fixed to the middle case 20. The cooler 40 cools the semiconductor elements 94 via the lower circuit board 90 and the solder layer 93 by a coolant flowing in the coolant flow path 46.

The case 50 is typically a molded article made of non-conductive resin (synthetic resin), and includes a vertical peripheral wall 52 that moves around the vertical axis on the plane parallel to the x-y plane, a pair of concave portions 54 formed by depressing a part of an upper surface of the vertical peripheral wall 52, a pair of convex portions 56 respectively formed in a projecting manner in a bottom portion of the pair of concave portions, and a mounting portion 58 formed respectively at four corners outside of the vertical peripheral wall 52 and mounted on the support portion 48 of the cooler 40 correspondingly by fastening or the like. The vertical peripheral wall 52 is a rectangular frame body with the direction parallel to the x-axis being a longitudinal direction and the direction parallel to the y-axis being a width direction, as viewed in a plan view.

The output-side three-phase terminal 86 includes an output-side U-phase terminal 86U, an output-side V-phase terminal 86V, and an output-side W-phase terminal 86W, which are sequentially arranged adjacent to each other in the positive direction of the x-axis and fixed to an outside wall of the vertical peripheral wall 52 of the case 50 on the negative direction side of the y-axis. These terminals are electrically connected with the corresponding terminals of the semiconductor elements 94, and are also electrically connected with an output-side three-phase current connector mounted on the lower case 10.

The input-side three-phase terminal 88 includes an input-side U-phase terminal 88U, an input-side V-phase terminal 88V, and an input-side W-phase terminal 88W, which are sequentially arranged adjacent to each other on the positive direction side of the x-axis of the output-side three-phase terminal 86, and fixed to the outside wall of the vertical peripheral wall 52 of the case 50 on the negative direction side of the y-axis. These terminals are electrically connected with the corresponding terminals of the semiconductor elements 94, and are also electrically connected with an input-side three-phase current connector 18 mounted on the lower case 10.

The lower circuit board 90 is arranged parallel to the x-y plane and is typically a plate-like DCB (Direct Copper Bond) board, and is a circuit board obtained by bonding a copper circuit board 92 on an insulation board 91 being an alumina ceramic board. A lower surface of the insulation board 91 is mounted on an upper surface of the cooler 40, in which the coolant flow path 46 is formed, via a solder layer (not shown). The solder layer 93 is bonded at a predetermined portion on an upper surface of the copper circuit board 92.

The semiconductor elements 94 are typically power semiconductor elements such as an IGBT (Insulated Gate Bipolar Transistor), and bonded on the copper circuit board 92 of the lower circuit board 90 via the solder layer 93, and the terminals thereof are electrically connected to the copper circuit board 92 of the lower circuit board 90 correspondingly. The semiconductor elements 94, the smoothing capacitor in the lower case 10, and the step up/down reactor in the middle case 20 are constituent elements of a power conversion circuit.

The upper circuit board 100 is arranged parallel to the x-y plane and is typically a circuit board such as a plate-like PCB (Printed Circuit Board), and has a pair of through holes 102. Semiconductor elements and the like constituting a drive circuit (not shown) that drives the semiconductor elements 94 are mounted on the upper circuit board 100. A drive circuit of the upper circuit board 100 is electrically connected to a corresponding terminal of the semiconductor elements 94. Under drive control by the drive circuit, the semiconductor elements 94 cooperate with each other to perform a switching operation, thereby realizing a power converting function of the power conversion apparatus 2.

[Configuration of Bus-bar]

A configuration of the laminated bus-bar of the power conversion apparatus according to the present embodiment is described next in detail, with reference to FIG. 3B and FIG. 4 as well.

Figure 3B:
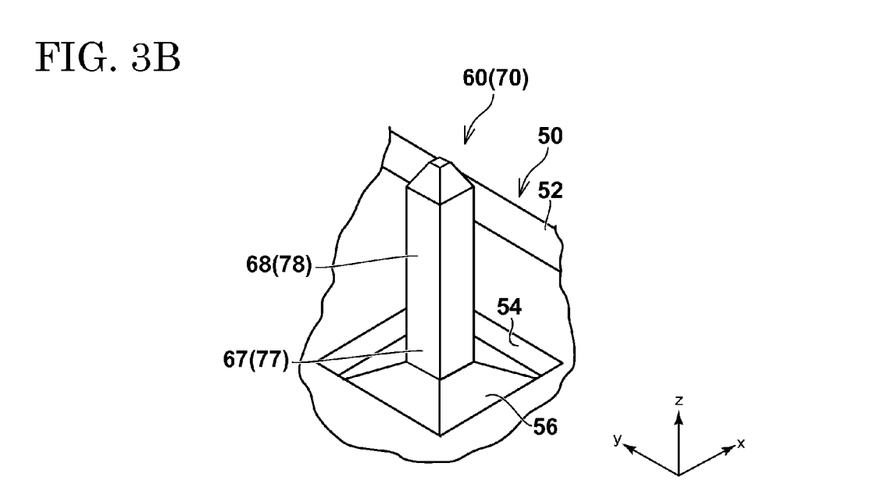
FIG. 3B is a partially enlarged perspective view of the power conversion apparatus according to the present embodiment.
Figure 4:
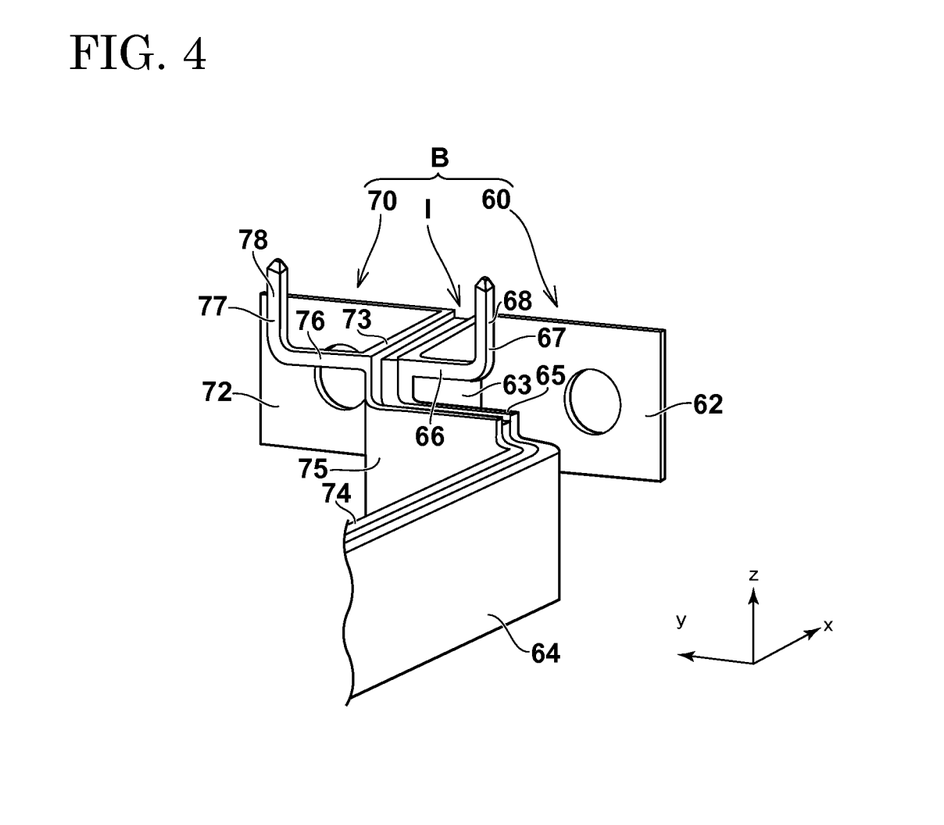
FIG. 4 is a partially enlarged perspective view showing a configuration of a laminated bus-bar of the power conversion apparatus according to the present embodiment.

FIG. 3B is a partially enlarged perspective view of the power conversion apparatus according to the present embodiment, and FIG. 4 is a partially enlarged perspective view showing the configuration of the laminated bus-bar of the power conversion apparatus according to the present embodiment. In FIG. 3B, illustrations of the upper circuit board are omitted. Because the configuration shown in FIG. 3B is common to both the first bus-bar 60 and the second bus-bar 70, reference numerals related to the second bus-bar 70 are indicated in brackets in FIG. 3B.

As shown in FIG. 3B and FIG. 4, the laminated bus-bar B is a laminated structure formed of the first bus-bar 60, the second bus-bar 70, and the insulating material I arranged therebetween. The laminated bus-bar B extends in a longitudinal direction in the case 50 so as to pass through a gap between the semiconductor elements 94 above the lower circuit board 90, and penetrates through the vertical peripheral wall 52 of the case 50 on the positive and negative directions sides of the x-axis to extend to the outside thereof. The first bus-bar 60 is electrically connected to the negative potential of the battery, while the second bus-bar 70 is electrically connected to the positive potential of the battery via the step up/down reactor in the middle case 20. The directions of an electric current flowing in the first bus-bar 60 and an electric current flowing in the second bus-bar 70 are opposite to each other. The insulating material I is an electrically insulating material, and the first bus-bar 60 and the second bus-bar 70 are fixed to the opposite sides of the insulating material I by using an adhesive as required.

Specifically, the first bus-bar 60 is formed of a conductive plate-like member, typically, one plate-like member made of metal arranged vertically so that the width direction thereof becomes a vertical direction. The first bus-bar 60 includes a first negative-potential connecting terminal portion 61 fixed to the outside wall of the vertical peripheral wall 52 of the case 50 on the negative direction side of the x-axis, a second negative-potential connecting terminal portion 62 fixed to the outside wall of the vertical peripheral wall 52 of the case 50 on the positive direction side of the x-axis, a high height portion 63 continuous to an end portion of the second negative-potential connecting terminal portion 62 on the positive direction side of the y-axis and extending therefrom inward of the vertical peripheral wall 52, a low height portion 64 continuous to an end portion of the first negative-potential connecting terminal portion 61 on the positive direction side of the y-axis and extending in the case 50, while extending therefrom inward of the vertical peripheral wall 52, and a connecting portion 65 that connects between the high height portion 63 and the low height portion 64. These components are all formed in a plate-like shape. These components are portions having a plate width relatively wider than a negative-potential-side measuring terminal described later in detail, and correspond to a bus-bar body. It is desired from a viewpoint of reducing the reactance of the laminated bus-bar B that a vertical length (a plate width) H1 of the high height portion 63 is set to be longer than a vertical length (a plate width) H2 of the low height portion 64, taking into consideration that the negative-potential-side measuring terminal is added thereto. The first negative-potential connecting terminal portion 61, the second negative-potential connecting terminal portion 62, the high height portion 63, and the low height portion 64 are portions having a relatively wide plate width, and correspond to the bus-bar body. The connecting portion 65 is additionally provided to connect the high height portion 63 and the low height portion 64, because these extending portions are deviated in the y-axis direction. Therefore, if these extending portions are continuous on the same straight line, the connecting portion 65 does not need to be provided. The first negative-potential connecting terminal portion 61 is electrically connected to the DC current connector 28 mounted on the middle case 20 via the smoothing capacitor in the lower case 10. The potential of the second negative-potential connecting terminal portion 62 is the most downstream side potential of the semiconductor elements 94 with respect to the battery. The low height portion 64 is electrically connected to the corresponding terminal of the semiconductor elements 94.

The first bus-bar 60 further includes a projecting portion 66 that is continuous to an upper end portion of the high height portion 63 on the negative direction side of the x-axis, is then bent so as to be branched in the negative direction of the y-axis, and extends above the connecting portion 65 while projecting in the negative direction of the y-axis. The first bus-bar 60 also includes an upright portion 67 that is continuous to an end portion of the projecting portion 66 on the negative direction side of the y-axis, is then bent upward, and extends while projecting in the upward direction, and a first measuring terminal portion 68 that is an upper constituent portion of the upright portion 67 and is electrically connected to the upper circuit board 100. The projecting portion 66, the upright portion 67, and the first measuring terminal portion 68 respectively have a length in a plate-width direction that is shorter than the length in the plate-width direction of the high height portion 63 and the low height portion 64, and substantially constitute a bar-like negative-potential-side measuring terminal. The projecting portion 66 contributes to increase thermal resistance between the end portions of the negative-potential-side measuring terminal by setting the whole length thereof to be long. Such increase in thermal resistance contributes to improving solderability by reducing heat dissipation at the time of soldering the first measuring terminal portion 68 to the upper circuit board 100 by flow solder or the like. However, a projecting direction of the projecting portion 66 can be parallel to the negative direction of the y-axis or a direction intersecting with the negative direction of the y-axis. A height position of an upper end of the projecting portion 66 is desirably set so as to be equal to a height position of an upper end of the high height portion 63, with the upper end of the projecting portion 66 being flush with the upper end of the high height portion 63, from a viewpoint of not deteriorating the yield at the time of forming the first bus-bar 60 and not unnecessarily raising the height position of an upper end of the laminated bus-bar B and the height position of an upper end of the vertical peripheral wall 52 of the case 50. The projecting portion 66 and the upright portion 67 are mainly linear; however, can be formed in a curved shape or the like so as to set the whole length of the negative-potential-side measuring terminal to be longer.

Meanwhile, the second bus-bar 70 is formed of a conductive plate-like member, typically, one plate-like member made of metal arranged vertically so that the width direction thereof becomes a vertical direction, as in the first bus-bar 60. The second bus-bar 70 includes a first positive-potential connecting terminal portion 71 fixed to the outside wall of the vertical peripheral wall 52 of the case 50 on the negative direction side of the x-axis, a second positive-potential connecting terminal portion 72 fixed to the outside wall of the vertical peripheral wall 52 of the case 50 on the positive direction side of the x-axis, a high height portion 73 continuous to an end portion of the second positive-potential connecting terminal portion 72 on the negative direction side of the y-axis and extending therefrom inward of the vertical peripheral wall 52, a low height portion 74 continuous to an end portion of the first positive-potential connecting terminal portion 71 on the negative direction side of the y-axis and extending in the case 50, while extending therefrom inward of the vertical peripheral wall 52, and a connecting portion 75 that connects between the high height portion 73 and the low height portion 74. These components are all formed in a plate-like shape. These components are portions having a plate width relatively wider than a positive-potential-side measuring terminal described later in detail, and correspond to the bus-bar body. It is desired from a viewpoint of reducing the reactance of the laminated bus-bar B that a vertical length (a plate width) of the high height portion 73 is set to be longer than a vertical length (a plate width) of the low height portion 74, taking into consideration that the positive-potential-side measuring terminal is added thereto. The connecting portion 75 is additionally provided to connect the high height portion 73 and the low height portion 74, because these extending portions are deviated in the y-axis direction. Therefore, if these extending portions are continuous on the same straight line, the connecting portion 75 does not need to be provided. The first positive-potential connecting terminal portion 71 is electrically connected to the DC current connector 28 mounted on the middle case 20 via the smoothing capacitor in the lower case 10 and the step up/down reactor in the middle case 20. The potential of the second positive-potential connecting terminal portion 72 is the most downstream side potential of the semiconductor elements 94 with respect to the battery. The low height portion 74 is electrically connected to the corresponding terminal of the semiconductor elements 94.

The second bus-bar 70 further includes a projecting portion 76 that is continuous to an upper end portion of the high height portion 73 on the negative direction side of the x-axis, is then bent so as to be branched in the positive direction of the y-axis, and extends while projecting in the positive direction of the y-axis. The second bus-bar 70 also includes an upright portion 77 that is continuous to an end portion of the projecting portion 76 on the positive direction side of the y-axis, is then bent upward, and extends while projecting in the upward direction, and a second measuring terminal portion 78 that is an upper constituent portion of the upright portion 77 and is electrically connected to the upper circuit board 100. The projecting portion 76, the upright portion 77, and the second measuring terminal portion 78 respectively have a length in a plate-width direction that is shorter than the length in the plate-width direction of the high height portion 73 and the low height portion 74, and substantially constitute a bar-like positive-potential-side measuring terminal. The projecting portion 76 contributes to increase thermal resistance between the end portions of the positive-potential-side measuring terminal by setting the whole length thereof to be long. Such increase in thermal resistance contributes to improving solderability by reducing heat dissipation at the time of soldering the second measuring terminal portion 78 to the upper circuit board 100 by flow solder or the like. However, a projecting direction of the projecting portion 76 can be parallel to the positive direction of the y-axis or a direction intersecting with the positive direction of the y-axis. A height position of an upper end of the projecting portion 76 is desirably set so as to be equal to a height position of an upper end of the high height portion 73, with the upper end of the projecting portion 76 being flush with the upper end of the high height portion 73, from a viewpoint of not deteriorating the yield of the second bus-bar 70 and not unnecessarily raising the height position of the upper end of the laminated bus-bar B and the height position of the upper end of the vertical peripheral wall 52 of the case 50. The projecting portion 76 and the upright portion 77 are mainly linear; however, can be formed in a curved shape or the like so as to set the whole length of the positive-potential-side measuring terminal to be longer.

More specifically, the negative-potential-side measuring terminal formed of the projecting portion 66, the upright portion 67, and the first measuring terminal portion 68 in the first bus-bar 60 and the positive-potential-side measuring terminal formed of the projecting portion 76, the upright portion 77, and the second measuring terminal portion 78 in the second bus-bar 70 are arranged symmetrically to each other in the y-axis direction with respect to the extending direction parallel to the x-axis direction in the laminated bus-bar B at a portion corresponding to the high height portion 63 and the high height portion 73, that is, arranged plane-symmetrically with respect to a central plane parallel to an x-z plane at the center in the y-axis direction of the high height portion 63 in the first bus-bar 60 and the high height portion 73 in the second bus-bar 70. As a result, the projecting portion 66 and the projecting portion 76 are arranged so as to extend on the same straight line with each other, with the lengths thereof being equal, and the upright portion 67 terminating at the first measuring terminal portion 68 and the upright portion 77 terminating at the second measuring terminal portion 78 are arranged so as to extend parallel to each other, with the lengths thereof being equal. This is to reduce impact on the reactance of the laminated bus-bar B, without adversely affecting the effective capacity of the space in the case 50 unnecessarily. The central plane corresponds to a central plane parallel to the x-z plane, when the insulating material I has a plate-like shape. Further, when the connecting portion 65 in the first bus-bar 60 and the connecting portion 75 in the second bus-bar 70 are not provided, the negative-potential-side measuring terminal and the positive-potential-side measuring terminal can be simply described as being arranged symmetrically in the y-axis direction with respect to the extending direction parallel to the x-axis direction in the laminated bus-bar B.

Further, in the laminated bus-bar B, it is desired that the entire high height portion 63, projecting portion 66, high height portion 73, and projecting portion 76 are integrally molded with the vertical peripheral wall 52 of the case 50, from a viewpoint of reliably fixing the laminated bus-bar B to the case 50 while reducing the number of components of the entire apparatus, in a mode with electrical insulation properties thereof being ensured.

In the laminated bus-bar B, the respective lower portions of the upright portion 67 and the upright portion 77 are integrally formed with the vertical peripheral wall 52 of the case 50. However, the upper portions thereof, the first measuring terminal portion 68, and the second measuring terminal portion 78 are exposed above the vertical peripheral wall 52 of the case 50. Further, at an upper end of the vertical peripheral wall 52, the pair of concave portions 54 is provided by depressing the upper surface thereof, and the upper portions of the upright portions 67 and 77 preferably extend upward correspondingly from the pair of concave portions 54 and are exposed. This is for setting a clearance space of a solder W, particularly of a fillet, by the pair of concave portions 54 on the lower surface side of the upper circuit board 100, at the time of soldering the first measuring terminal portion 68 and the second measuring terminal portion 78 to the upper circuit board 100 correspondingly via the pair of through holes 102 by the solder W. The soldering is typically flow soldering. Further, it is preferable that the convex portions 56 respectively formed in a projecting manner on the upper surfaces of the pair of concave portions 54 are provided at the bottom portions thereof. This is for reinforcing and supporting the exposed lower end portions of the upright portions 67 and 77 extending outside from the vertical peripheral wall 52 by the convex portions 56.

As is apparent from the above explanations, in the power conversion apparatus 2 according to the present embodiment, the laminated bus-bar B electrically connected to the semiconductor elements 94 has a configuration in which the pair of plate-like bus-bars 60 and 70 is laminated via the insulating material I, and the pair of bus-bars 60 and 70 is vertically arranged so that the width direction thereof becomes the vertical direction. The laminated bus-bar B includes the pair of voltage measuring terminals 65 to 68 and 75 to 78 that is branched from a part of each one of the pair of bus-bars 60 and 70 to extend toward the circuit board 100, and is electrically connected to the circuit board 100. The pair of voltage measuring terminals 65 to 68 and 75 to 78 is arranged symmetrically with respect to the pair of bus-bars 60 and 70 to extend upward toward the circuit board 100, while extending in the intersecting direction intersecting with the pair of bus-bars 60 and 70, and electrically connected to the circuit board 100. Therefore, the power conversion apparatus 2 that can measure the voltage of the bus-bars with a simple structure, while improving solderability and ensuring insulation properties can be provided. Particularly, because the pair of voltage measuring terminals 65 to 68 and 75 to 78 is arranged symmetrically with respect to the pair of bus-bars 60 and 70 to extend upward toward the circuit board 100, while extending in the intersecting direction intersecting with the pair of bus-bars 60 and 70, and electrically connected to the circuit board 100, the number of components can be reduced, and space saving and downsizing of the entire configuration can be realized, while reducing impact on the reactance of the laminated bus-bar B. Further, the length of the voltage measuring terminals can be increased, to increase thermal resistance of the voltage measuring path. Accordingly, heat dissipation to the pair of bus-bars from the pair of voltage measuring terminals 65 to 68 and 75 to 78 can be decreased, and as a result, solderability at the time of flow soldering or the like can be improved.

Further, in the power conversion apparatus 2 according to the present embodiment, each one of the pair of bus-bars 60 and 70 includes the plate-like high height portions 63 and 73 and the plate-like low height portions 64 and 74 respectively having a shorter vertical length than the high height portions 63 and 73. Each one of the pair of voltage measuring terminals 65 to 68 and 75 to 78 includes the projecting portions 66 and 76 extending in the intersecting direction from the upper end portion of the high height portions 63 and 73 and the upright portions 67 and 77 extending upward from the projecting portions 66 and 76, and the upper ends of the projecting portions 67 and 77 are respectively set to be flush with the upper ends of the corresponding high height portions 63 and 73, and the upper portions of the upright portions 67 are 77 are respectively set in the measuring terminal portions 68 and 78 and electrically connected to the circuit board 100. Accordingly, the yield at the time of molding the pair of bus-bars 60 and 70 can be improved, space saving and downsizing of the entire configuration can be realized, while the reactance of the laminated bus-bar B is not increased unnecessarily.

Further, in the power conversion apparatus 2 according to the present embodiment, the resin case 50 for housing the semiconductor elements 94 is further provided. A part of the laminated bus-bar B is molded in the resin case 50, and the resin case 50 has the pair of concave portions 54 by depressing the upper end face of the peripheral wall 52 thereof, and the pair of voltage measuring terminals 65 to 68 and 75 to 78 is extended upward correspondingly from the pair of concave portions 54. Accordingly, a clearance space of a fillet formed at the time of soldering the measuring terminal portions 68 and 78 can be ensured, while electrically insulating a portion including the measuring terminal portions 68 and 78 of the laminated bus-bar B, with the number of components being reduced. As a result, a gap between the circuit board 100 and the laminated bus-bar B can be narrowed, thereby enabling to reduce the size of the resin case 50.

In the power conversion apparatus 2 according to the present embodiment, each one of the pair of concave portions 54 has the convex portion 56 formed in a projecting manner in the bottom portion of the pair of concave portions 54 in the portion where the pair of voltage measuring terminals 65 to 68 and 75 to 78 is correspondingly extended. Accordingly, anchorage strength and position accuracy of the pair of voltage measuring terminals 65 to 68 and 75 to 78 can be improved.

In the present invention, the type, the form, the arrangement, the number, and the like of the constituent members are not limited to those in the embodiment explained above, and it is needless to mention that the constituent elements can be modified as appropriate without departing from the scope of the invention, such as appropriately replacing these elements by other ones having identical operational effects.

As described above, the present invention can provide the power conversion apparatus that can measure the voltage of a bus-bar with a simple structure, while improving solderability and ensuring insulation properties.

Therefore, because of its general purposes and universal characteristics, applications of the present invention can be expected in a wide range in the field of a power control apparatus for vehicles such as a hybrid car.

Reference is hereby made to a Patent Application No. TOKUGAN 2014-185133 with a filing date of Sep. 11, 2014 in Japan, the entire content of which is incorporated herein by reference.

What is claimed is:
1. A power conversion apparatus comprising:
a semiconductorelement;

a cooler cooling the semiconductor element;
a circuit board electrically connected to the semiconductor element; and
a laminated bus-bar electrically connected to the semiconductor element, with the semiconductor element and the laminated bus-bar being disposed above the cooler, and the circuit board being further disposed above the semiconductor element and the laminated bus-bar, to exhibit a power converting function by a switching operation of the semiconductor element,
wherein the laminated bus-bar has a configuration in which plate-like bus-bars are laminated via an insulating material to define a pair of bus-bars, and the pair of bus-bars is disposed vertically so that a width thereof is set in a vertical direction,
and wherein the laminated bus-bar includes a pair of voltage measuring terminals that is correspondingly branched from a part of the pair of bus-bars to extend toward the circuit board to be electrically connected thereto, the pair of voltage measuring terminals respectively having projecting portions and upright portions, the projecting portions of the pair of voltage measuring terminals respectively projecting from opposite surfaces of the laminated bus-bar, and the upright portions of the pair of voltage measuring terminals respectively extending from respective ends of the projecting portions upwards towards the circuit board.

2. The power conversion apparatus according to claim 1, wherein each of the pair of bus-bars includes a plate-like high height portion and a plate-like low height portion having a shorter vertical length than the high height portion, each of the projecting portions of the pair of voltage measuring terminals extends from an upper end portion of the high height portion away from the corresponding one of the opposite surfaces of the laminated bus-bar, and an upper end of each of the projecting portions of the pair of voltage measuring terminals is set to be flush with the upper end of the corresponding high height portion.

3. The power conversion apparatus according to claim 1, wherein the power conversion apparatus further comprises a resin case accommodating the semiconductor element, a part of the laminated bus-bar is molded in the resin case, the resin case has a pair of concave portions by depressing an upper end face of a peripheral wall thereof, and the pair of voltage measuring terminals is extended out upward correspondingly from the pair of concave portions.

4. The power conversion apparatus according to claim 3, wherein each one of the pair of concave portions has a convex portion projected from a bottom portion of the pair of concave portions where the pair of voltage measuring terminals is correspondingly extended out.

* * * * *